(12) United States Patent
Schneider et al.

(10) Patent No.: US 11,745,286 B2
(45) Date of Patent: Sep. 5, 2023

(54) METHODS AND APPARATUS TO DETECT STRAY WELDING-TYPE CURRENT

(71) Applicant: Illinois Tool Works Inc., Glenview, IL (US)

(72) Inventors: Joseph C. Schneider, Greenville, WI (US); Michael D. Madsen, Freemont, WI (US); Bernard J. Vogel, Troy, OH (US); Andrew J. Henry, Appleton, WI (US)

(73) Assignee: Illinois Tool Works Inc., Glenview, IL (US)

( * ) Notice: Subject to any disclaimer, the term of this patent is extended or adjusted under 35 U.S.C. 154(b) by 494 days.

(21) Appl. No.: 16/887,491

(22) Filed: May 29, 2020

(65) Prior Publication Data
US 2021/0016387 A1    Jan. 21, 2021

Related U.S. Application Data

(60) Provisional application No. 62/855,222, filed on May 31, 2019.

(51) Int. Cl.
| | | |
|---|---|---|
| *B23K 11/25* | (2006.01) | |
| *B23K 9/10* | (2006.01) | |
| *B23K 11/24* | (2006.01) | |

(52) U.S. Cl.
CPC .......... *B23K 11/25* (2013.01); *B23K 9/1043* (2013.01); *B23K 11/241* (2013.01)

(58) Field of Classification Search
CPC ...... B23K 9/1006; B23K 9/32; B23K 9/1043; B23K 11/241; B23K 11/25; B23K 11/257; B23K 37/006
See application file for complete search history.

(56) References Cited

U.S. PATENT DOCUMENTS

| | | | |
|---|---|---|---|
| 2016/0252563 A1* | 9/2016 | Church | B61L 1/188 |
| | | | 324/551 |
| 2017/0168106 A1* | 6/2017 | Bridges | G01R 31/52 |

FOREIGN PATENT DOCUMENTS

| | | |
|---|---|---|
| DE | 19921295 | 11/2000 |
| EP | 1089080 | 4/2001 |

OTHER PUBLICATIONS

Int'l Search Report and Written Opinion Appln. No. PCT/US2020/035458 dated Oct. 2, 2020.

* cited by examiner

*Primary Examiner* — Brian W Jennison
(74) *Attorney, Agent, or Firm* — McAndrews, Held & Malloy, Ltd.

(57) ABSTRACT

An example welding-type power supply includes: power conversion circuitry configured to convert input power to welding-type power, and to output the welding-type power via a welding-type circuit; a temperature sensor configured to measure a temperature of at least one component of the welding-type power supply; and stray current detection circuitry configured to detect stray welding-type current based on the measured temperature of the at least one component.

15 Claims, 7 Drawing Sheets

METHODS AND APPARATUS TO DETECT STRAY WELDING-TYPE CURRENT

RELATED APPLICATIONS

The present application claims the benefit of U.S. Patent Application Ser. No. 62/855,222, filed May 31, 2019, entitled "METHODS AND APPARATUS TO DETECT STRAY WELDING-TYPE CURRENT." The entirety of U.S. Patent Application Ser. No. 62/855,222 is expressly incorporated herein by reference.

BACKGROUND

This disclosure relates generally to welding and, more particularly, to methods and apparatus to detect stray welding-type current.

In a welding system, stray welding currents can exist, in which the return path for the weld circuit is completed through conductive paths other than the intended weld circuit conductors. Stray welding currents occur when an error is made or a fault occurs and the alternative path for weld current is made through other conductive materials.

SUMMARY

Methods and apparatus to detect stray welding-type current are disclosed, substantially as illustrated by and described in connection with at least one of the figures, as set forth more completely in the claims.

BRIEF DESCRIPTION OF THE DRAWINGS

The figures are not necessarily to scale. Where appropriate, similar or identical reference numbers are used to refer to similar or identical components.

DETAILED DESCRIPTION

Figure 1:
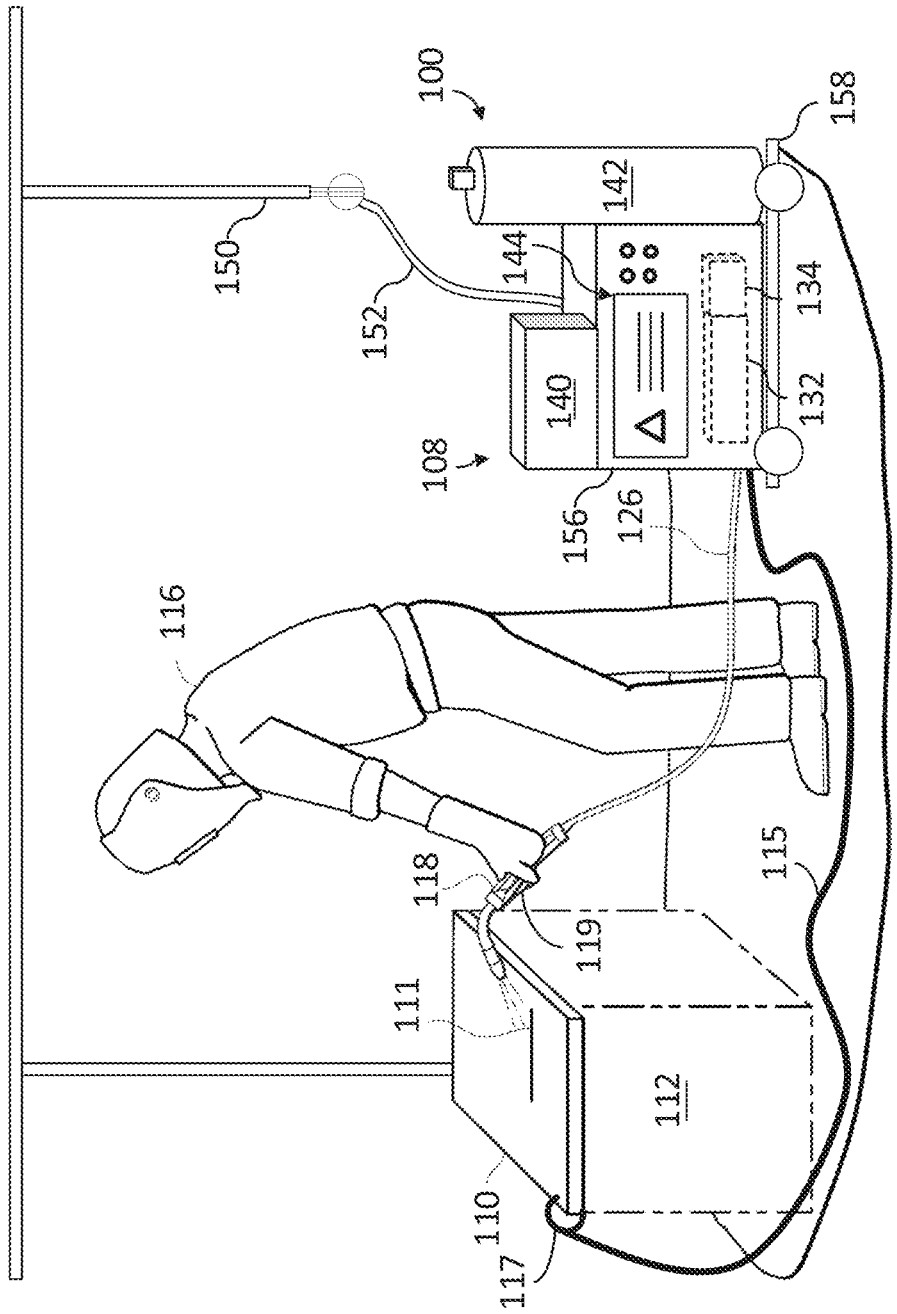
FIG. 1 illustrates an example welding-type system in which stray welding-type currents may be present due to errors or faults, in accordance with aspects of this disclosure.

For the purpose of promoting an understanding of the principles of this disclosure, reference will be now made to the examples illustrated in the drawings and specific language will be used to describe the same. It will nevertheless be understood that no limitation of the scope of the claims is intended by this disclosure. Modifications in the illustrated examples and such further applications of the principles of this disclosure as illustrated therein are contemplated as would typically occur to one skilled in the art to which this disclosure relates.

In cases in which the weld circuit is completed via stray welding-type current paths (e.g., non-intended current paths) and the arc is struck, an operator may not realize or be aware of the existence of stray welding-type currents. However, stray welding-type currents have the potential to cause damage and/or premature wear to welding-type equipment and/or infrastructure, and/or may create poor welding conditions.

Disclosed example systems and methods detect stray welding-type currents, in both individual configurations and group configurations. Example techniques used by disclosed system and methods involve detecting increases in temperature through components due to stray welding-type currents, using wireless current sniffers to detect currents, and/or comparing actual welding-type output power to expected welding-type output power. Disclosed example systems and methods may further provide one or more responses to detecting stray welding-type currents, such as limiting, stopping, and/or disabling output from the power supply, outputting an alarm or alert to personnel, and/or outputting notifications to other power supplies that stray welding-type currents have been detected.

As used herein, the term "stray welding-type current" refers to welding-type current that is outside of an intended welding-type current path. A typical intended welding-type current path includes the power conversion circuitry secondary or output circuitry, the welding torch cable, the welding torch, the arc, the workpiece, a work cable, a work clamp properly attached near the workpiece (e.g., in accordance with applicable welding codes) and, where present, equipment such as a welding table that is intended to conduct current between the workpiece and the work clamp. Stray welding-type current may include current flowing through infrastructure such as conduit or piping, electrical system grounding conductors, a frame or enclosure of the welding-type power supply, conductive equipment such as a cart or table on which the power supply or other equipment is positioned, and/or any other current paths outside of an intended welding-type current path.

As utilized herein the terms "circuits" and "circuitry" refer to physical electronic components (i.e. hardware) and any software and/or firmware (code) that may configure the hardware, be executed by the hardware, and/or otherwise be associated with the hardware. As used herein, for example, a particular processor and memory may comprise a first "circuit" when executing a first set of one or more lines of code and may comprise a second "circuit" when executing a second set of one or more lines of code. As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y, and/or z" means "one or more of x, y and z". As utilized herein, the term "exemplary" means serving as a non-limiting example, instance, or illustration. As utilized herein, the terms "e.g." and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by an operator-configurable setting, factory trim, etc.).

As used herein, a welding-type power supply refers to any device capable of, when power is applied thereto, supplying welding, cladding, plasma cutting, induction heating, laser (including laser welding and laser cladding), carbon arc cutting or gouging and/or resistive preheating, including but not limited to transformer-rectifiers, inverters, converters, resonant power supplies, quasi-resonant power supplies, switch-mode power supplies, etc., as well as control circuitry and other ancillary circuitry associated therewith. The terms "power source" and "power supply" are used interchangeably herein.

Some disclosed examples describe electric currents being conducted "from" and/or "to" locations in circuits and/or power supplies. Similarly, some disclosed examples describe "providing" electric current via one or more paths, which may include one or more conductive or partially conductive elements. The terms "from," "to," and "providing," as used to describe conduction of electric current, do not necessitate the direction or polarity of the current. Instead, these electric currents may be conducted in either direction or have either polarity for a given circuit, even if an example current polarity or direction is provided or illustrated.

Disclosed example welding-type power supplies include power conversion circuitry configured to convert input power to welding-type power and to output the welding-type power via a welding-type circuit, a temperature sensor configured to measure a temperature of at least one component of the welding-type power supply, and stray current detection circuitry configured to detect stray welding-type current based on the measured temperature of the at least one component.

In some example welding-type power supplies, the stray current detection circuitry is configured to detect the stray welding-type current when the measured temperature satisfies a threshold temperature. Some example welding-type power supplies further include a second temperature sensor configured to measure a reference temperature, in which the stray current detection circuitry is configured to detect the stray welding-type current when a difference between A) the measured temperature of the at least one component, and B) the reference temperature, satisfies a threshold difference. In some examples, the reference temperature is an ambient temperature.

In some example welding-type power supplies, the stray current detection circuitry is configured to output an alarm or alert in response to detecting the stray welding-type current. In some example welding-type power supplies, the stray current detection circuitry is configured to limit an output of the welding-type power in response to detecting the stray welding-type current. In some examples, the stray current detection circuitry is configured to continue disabling the output until a reset of the stray current detection circuitry.

Some example welding-type power supplies further include communication circuitry configured to transmit a stray current detection signal to a second welding-type power supply in response to the detection of the stray welding-type current to cause the second welding-type power supply to disable a welding-type output of the second welding-type power supply. Some example welding-type power supplies further include a battery configured to provide power to the temperature sensor, and the stray current detection circuitry is configured to detect the stray welding-type current when the power conversion circuitry is not outputting welding-type power. In some examples, components may include a frame, an enclosure, or a protective conductor of the welding-type power supply.

Some other disclosed welding-type power supplies include power conversion circuitry configured to convert input power to welding-type power and to output the welding-type power via a weld circuit, communication circuitry configured to wirelessly receive a stray current signal from a non-contact current detector, in which the stray current signal is indicative of whether stray welding-type current is sensed by the non-contact current detector, and stray current detection circuitry configured to control the power conversion circuitry to disable output of the welding-type power based on the stray current signal.

In some example welding-type power supplies, the stray current signal indicates that stray welding-type current is not sensed, and the stray current detection circuitry is configured to disable the output of the welding-type power in response to an absence of the stray current signal for at least a threshold time. In some example welding-type power supplies, the stray current signal indicates that stray welding-type current is sensed, and the stray current detection circuitry is configured to disable the output of the welding-type power in response to receiving the stray current signal. In some example welding-type power supplies, the communication circuitry is configured to receive the stray current signal from a plurality of non-contact current detectors, and the stray current detection circuitry is configured to disable the output of the welding-type power based on any of the stray current signals being indicative of stray welding-type current.

Some other disclosed example welding-type power supplies include power conversion circuitry configured to convert input power to welding-type power, and to output the welding-type power via a weld circuit; and control circuitry configured to: control the power conversion circuitry to output the welding-type power; monitor an actual output of the welding-type power; compare the actual output to an expected output of the power conversion circuitry; and identify a stray welding-type current when a difference between the actual output and the expected output satisfies a threshold.

In some example welding-type power supplies, the control circuitry is configured to compare the actual output to the commanded output using a proportional-integral control loop. In some example welding-type power supplies, the control circuitry is configured to control the power conversion circuitry to stop output of the welding-type power in response to identifying the stray welding-type current. In some example welding-type power supplies, the control circuitry is configured to control the power conversion circuitry to output an alarm or alert in response to identifying the stray welding-type current.

FIG. 1 illustrates an example welding-type system 100 in which stray welding-type currents may be present due to errors or faults. As illustrated in FIG. 1, the welding system 100 includes a welding torch 118 and work clamp 117 coupled to a welding-type power supply 108.

In the example of FIG. 1, an operator 116 is handling the welding torch 118 near a welding bench 112. In some examples, the welding bench 112 may be and/or include a fixturing system configured to hold one or more workpiece (s) 110. In some examples the fixturing system may include one or more work clamps 117 (e.g., manual and/or pneumatic clamps). While a human operator 116 is shown in FIG. 1, in some examples, the operator 116 may be a robot and/or automated welding machine.

In the example of FIG. 1, the welding torch 118 is coupled to the welding-type power supply 108 via a welding cable 126. A clamp 117 is also coupled to the welding-type power supply 108 via a work cable 115. In some examples, the welding-type power supply 108 may alternatively, or additionally, include wireless communication capabilities (e.g., wireless communication circuitry), through which wireless communication may be established with local wireless devices.

In the example of FIG. 1, the welding torch 118 is a gun configured for gas metal arc welding (GMAW). In some examples, the welding torch 118 may comprise an electrode holder (i.e., stinger) configured for shielded metal arc welding (SMAW). In some examples, the welding torch 118 may comprise a torch and/or filler rod configured for gas tungsten arc welding (GTAW). In some examples, the welding torch 118 may comprise a gun configured for flux-cored arc welding (FCAW). In some examples, the welding torch 118 may additionally, or alternatively, comprise a filler rod. In the example of FIG. 1, the welding torch 118 includes a trigger 119. In some examples, the trigger 119 may be activated by the operator 116 to trigger a welding-type operation (e.g., arc).

In the example of FIG. 1, the welding-type power supply 108 includes (and/or is coupled to) a wire feeder 140. In some examples, the wire feeder 140 houses a wire spool that is used to provide the welding torch 118 with a wire electrode (e.g., solid wire, cored wire, coated wire). In some examples, the wire feeder 140 further includes motorized rollers configured to feed the wire electrode to the torch 118 (e.g., from the spool) and/or retract the wire electrode from the torch 118 (e.g., back to the spool).

In the example of FIG. 1, the welding-type power supply 108 also includes (and/or is coupled to) a gas supply 142. In some examples, the gas supply 142 supplies a shielding gas and/or shielding gas mixtures to the welding torch 118 (e.g., via cable 126). A shielding gas, as used herein, may refer to any gas (e.g., CO2, argon) or mixture of gases that may be provided to the arc and/or weld pool in order to provide a particular local atmosphere (e.g., shield the arc, improve arc stability, limit the formation of metal oxides, improve wetting of the metal surfaces, alter the chemistry of the weld deposit, and so forth).

In the example of FIG. 1, the welding-type power supply 108 also includes an operator interface 144. In the example of FIG. 1, the operator interface 144 comprises one or more adjustable inputs (e.g., knobs, buttons, switches, keys, etc.) and/or outputs (e.g., display screens, lights, speakers, etc.) on the welding-type power supply 108. In some examples, the operator interface 144 may comprise a remote control and/or pendant. In some examples, the operator 116 may use the operator interface 144 to enter and/or select one or more weld parameters (e.g., voltage, current, gas type, wire feed speed, workpiece material type, filler type, etc.) and/or weld operations for the welding-type power supply 108. In some examples, the operator interface 144 may further include one or more receptacles configured for connection to (and/or reception of) one or more external memory devices (e.g., floppy disks, compact discs, digital video disc, flash drive, etc.).

In the example of FIG. 1, the welding-type power supply 108 includes power conversion circuitry 132 configured to receive input power (e.g., from mains power, a generator, etc.) and convert the input power to welding-type output power. In some examples, the power conversion circuitry 132 may include circuit elements (e.g., transformers, rectifiers, capacitors, inductors, diodes, transistors, switches, and so forth) capable of converting the input power to output power. In some examples, the power conversion circuitry 132 may also include one or more controllable circuit elements. In some examples, the controllable circuit elements may comprise circuitry configured to change states (e.g., fire, turn on/off, close/open, etc.) based on one or more control signals. In some examples, the state(s) of the controllable circuit elements may impact the operation of the power conversion circuitry 132, and/or impact characteristics (e.g., current/voltage magnitude, frequency, waveform, etc.) of the output power provided by the power conversion circuitry 132. In some examples, the controllable circuit elements may comprise, for example, switches, relays, transistors, etc. In examples where the controllable circuit elements comprise transistors, the transistors may comprise any suitable transistors, such as, for example MOSFETs, JFETs, IGBTs, BJTs, etc.

As shown, the welding-type power supply 108 further includes control circuitry 134 electrically coupled to and configured to control the power conversion circuitry 132. In some examples, the control circuitry 134 may include processing circuitry (and/or one or more processors) as well as analog and/or digital memory. In some examples, the control circuitry 134 is configured to control the power conversion circuitry 132, so as to ensure the power conversion circuitry 132 generates the appropriate welding-type output power for carrying out the desired welding-type operation.

In some examples, the control circuitry 134 is also electrically coupled to and/or configured to control the wire feeder 140 and/or gas supply 142. In some examples, the control circuitry 134 may control the wire feeder 140 to output wire at a target speed and/or direction. For example, the control circuitry 134 may control the motor of the wire feeder 140 to feed the wire electrode to (and/or retract the wire electrode 250 from) the torch 118 at a target speed. In some examples, the welding-type power supply 108 may control the gas supply 142 to output a target type and/or amount gas. For example, the control circuitry 134 may control a valve in communication with the gas supply 142 to regulate the gas delivered to the welding torch 118.

In some examples, a welding operation (and/or welding process) may be initiated when the operator 116 activates the trigger 119 of the welding torch 118 (and/or otherwise activates the welding torch 118). During the welding operation, the welding-type power provided by the welding-type power supply 108 may be applied to the electrode (e.g., wire electrode) of the welding torch 118 in order to produce a welding arc between the electrode and the one or more workpieces 110. The heat of the arc may melt portions of a filler material (e.g., wire) and/or workpiece 110, thereby creating a molten weld pool. Movement of the welding torch 118 (e.g., by the operator) may move the weld pool, creating one or more welds 111. When the welding operation is finished, the operator 116 may release the trigger 119 (and/or otherwise deactivate the welding torch 118). As another example, the control circuitry 134 may receive a torch deactivation command via the operator interface 144 (e.g., where the torch 118 is maneuvered by a robot and/or automated welding machine).

The power conversion circuitry 132 is configured to output the welding-type output power to a welding circuit. In the example of FIG. 1, the welding circuit may include the welding cable 126, the welding torch 118, the welding arc, the workpiece 110, the welding bench 112, the clamp 117, and the work cable 115. However, in the case of erroneous configuration of the equipment, such as a failure to properly attach the clamp 117 and the work cable 115 to the workpiece 110 or the welding bench 112, stray welding-type currents may result, to complete the weld circuit for welding to occur. For example, stray welding-type currents may flow through local infrastructure such as conduit or piping (e.g., electrical conduit 150), electrical system grounding conductors (e.g., a grounding conductor 152 for a three-phase or single-phase input power cable 154), a frame or enclosure 156 of the welding-type power supply 108, conductive equipment such as a cart 158 or table on which the power supply 108 or other equipment is positioned, and/or any other current paths outside of an intended welding-type current path.

The example power supply 108 is configured to detect welding-type currents via one or more methods, which are disclosed in more detail below: temperature measurement, wireless current sniffers, and/or monitoring and comparing actual welding-type output power to expected welding-type output power.

Figure 2:
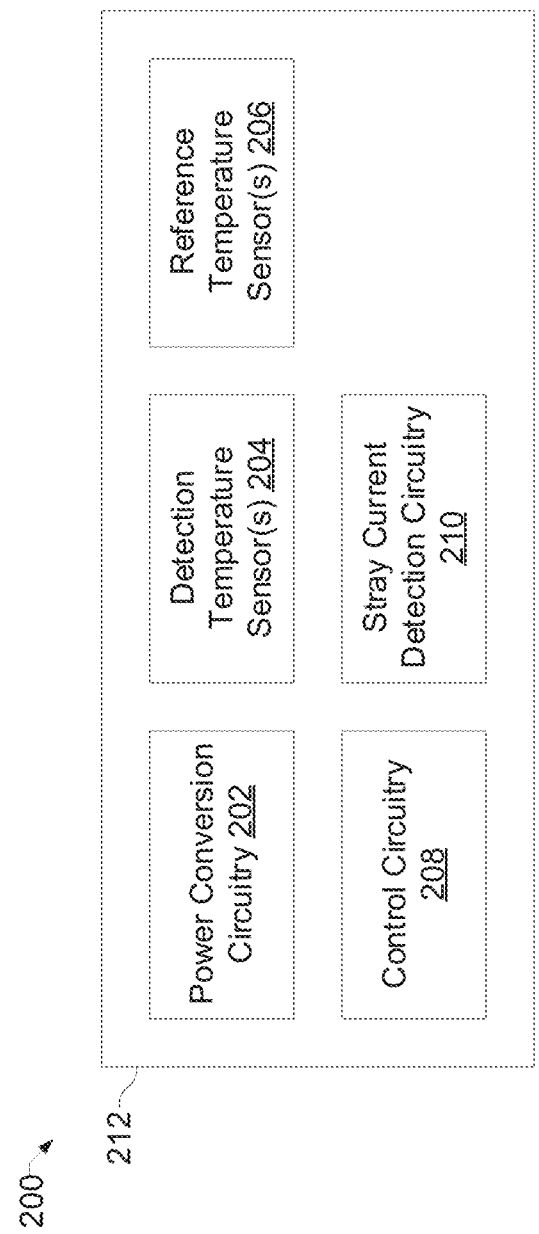
FIG. 2 is a block diagram of an example welding-type power supply configured to detect stray welding-type current based on temperature measurements of one or more potential stray welding-type current paths.

FIG. 2 is a block diagram of an example welding-type power supply 200 configured to detect stray welding-type current based on temperature measurements of one or more potential stray welding-type current paths. The example welding-type power supply 200 may be used to implement the power supply 108 of FIG. 1 to detect stray welding-type currents.

The example welding-type power supply 200 includes power conversion circuitry 202, one or more detection temperature sensor(s) 204, a reference temperature sensor 206, control circuitry 208, stray current detection circuitry 210, and an enclosure 212. The example welding-type power supply 200 detects stray welding-type currents by identifying increases in component temperatures caused by resistive heating. For example, components of the power supply that are not intended to conduct current (e.g., welding-type current) may be constructed using thin, low-gauge, and/or otherwise high-resistance conductive materials. When currents on the order of welding-type currents are conducted through these unintended components, the currents cause substantial resistive heating and noticeably increase the temperature of the components.

The power conversion circuitry 202 may be similar or identical to the power conversion circuitry 132, and is configured to convert input power to welding-type power, and to output the welding-type power via a weld circuit. The detection temperature sensor 204 configured to measure a temperature of at least one component of the welding-type power supply 200. The component(s) that are measured by the detection temperature sensor(s) 204 may be selected as components through which stray currents are expected, most likely, reasonably anticipated, and/or possible. For example, the detection temperature sensor(s) 204 may be configured to measure the temperature(s) of a frame, one or more surfaces of the enclosure 212 and/or a protective ground conductor.

The reference temperature sensor 206 is configured to measure a reference temperature, such as an ambient temperature within the enclosure 212, a temperature of a reference component of the power supply 200, and/or a temperature exterior to the enclosure 212. The reference temperature sensor 206 may be used as a basis against which measurements from the detection temperature sensor(s) 204 can be compared to detect stray currents through the power supply 200.

The stray current detection circuitry 210 is configured to detect stray welding-type current based on the measured temperature of the at least one component by the detection temperature sensor(s) 204. For example, the stray current detection circuitry 210 may detect that stray welding-type current is present in a component when the measured temperature of the component (or adjacent the component) by a corresponding detection temperature sensor 204 satisfies a threshold temperature. In such examples, the reference temperature sensor 206 may be omitted, and the threshold temperature may be set to a temperature that is unlikely to occur in the absence of stray welding-type currents to reduce or minimize false detections.

Additionally or alternatively, the stray current detection circuitry 210 is configured to detect that stray welding-type current is present in a component when a difference between A) the measured temperature of the component by the corresponding detection temperature sensor 204, and B) the reference temperature measured by the reference temperature sensor 206, satisfies a threshold difference (e.g., is more than a threshold difference). In such examples, the stray current detection circuitry 210 may use a temperature differential, rather than an absolute temperature, to improve stray current detection and reduce false detections.

In response to a detection of a stray welding-type current, the stray current detection circuitry 210 may output an alarm or alert, such as an alarm signal, an audible and/or visual alert, and/or any other method of notifying the operator or other appropriate personnel of the detection. Additionally or alternatively, the stray current detection circuitry 210 may limit the output of the power conversion circuitry (e.g., for troubleshooting) and/or disable the output of the welding-type power by the power conversion circuitry 202 (e.g., via the control circuitry 208, via a cutoff switch or other circuitry, etc.). The stray current detection circuitry 210 may continue to disable the output until a manual reset of the stray current detection circuitry 210 by the operator (e.g., via an input device configured to reset a stray current alarm). After a reset, the stray current detection circuitry 210 resumes detection via monitoring temperatures of the component(s) and/or the reference temperature.

Figure 3:
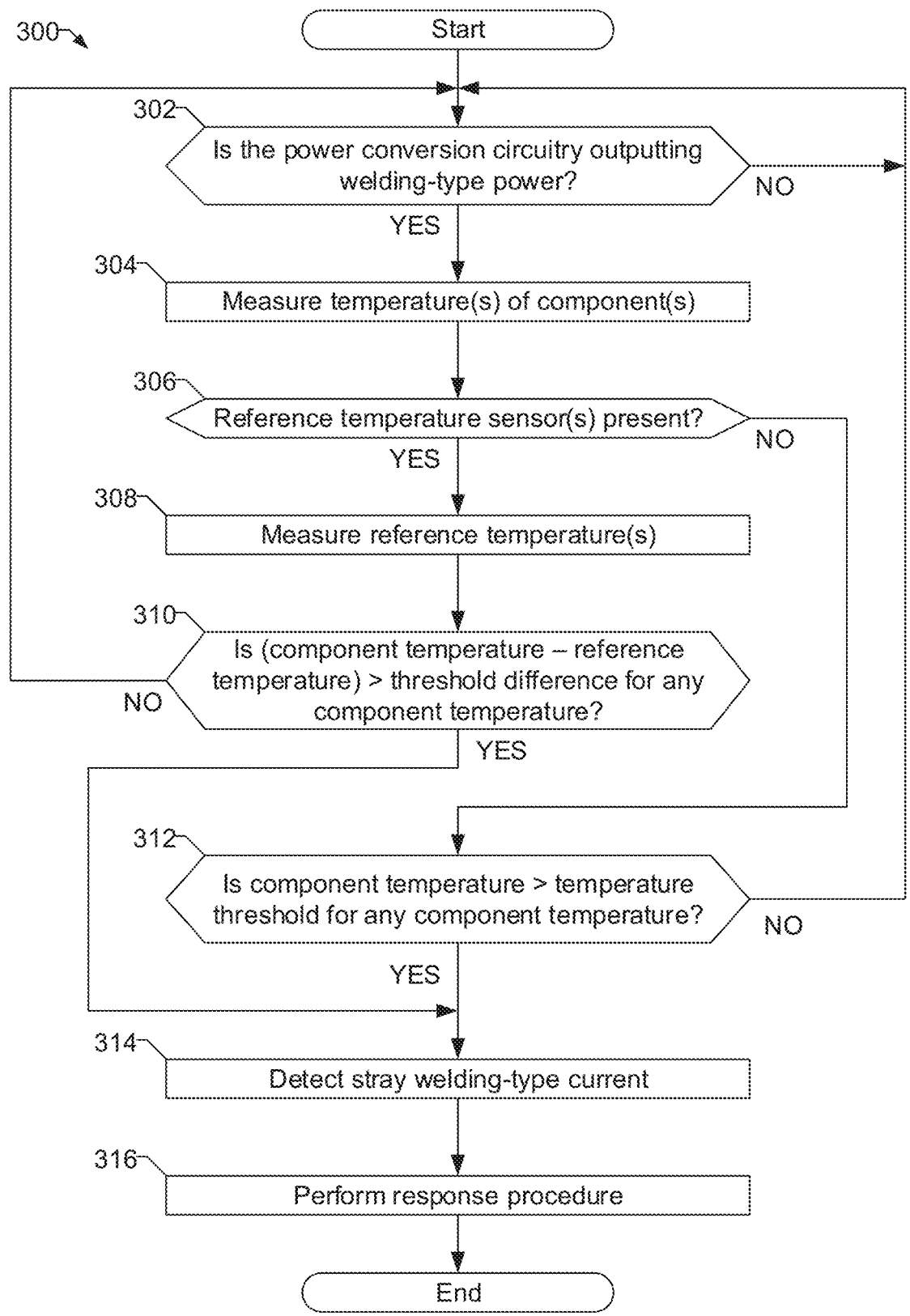
FIG. 3 is a flowchart representative of an example method which may be performed to detect stray welding-type current based on temperature measurements of one or more potential stray welding-type current paths.

FIG. 3 is a flowchart representative of an example method 300 to detect stray welding-type current based on temperature measurements of one or more potential stray welding-type current paths. The example method 300 may be performed to implement the example welding-type power supply 200 of FIG. 2. All or part of the method 300 may be implemented using machine readable instructions stored on a machine readable storage medium, and/or executed by processing circuitry such as the control circuitry 208 of FIG. 2.

At block 302, the control circuitry 208 determines whether the power conversion circuitry 202 is outputting welding-type power. For example, the stray current detection circuitry 210 may be disabled when welding-type power is not being output. In other examples, such as when multiple welding-type power supplies share a return lead or bus, and/or are located in close proximity, the stray current detection circuitry 210, the detection temperature sensor(s) 204, and the reference temperature sensor 206 may be configured to detect stray welding currents even when welding-type power is not being output by the power supply 200 and/or the power supply 200 is turned off. If the power conversion circuitry 202 is not outputting welding-type power (block 302), control returns to block 302.

If the power conversion circuitry 202 is outputting welding-type power (block 302), at block 304 the detection temperature sensor(s) 204 measure the temperature(s) of the corresponding component(s). If one or more reference temperature sensor(s) 206 are present (block 306), at block 308 the reference temperature sensor(s) 206 measure the reference temperature(s) and, at block 310, the stray current detection circuitry 210 determines whether a difference between the component temperature and the reference temperature is more than a threshold difference for any of the measured component temperatures.

Conversely, if reference temperature sensor(s) 206 are not present (block 306), at block 312 the stray current detection circuitry 210 determines whether any of the component temperatures are greater than a corresponding temperature threshold. If none of the component temperatures are greater than a corresponding temperature threshold (block 312), or the difference between the component temperature and the reference temperature is less than a threshold difference for all of the measured component temperatures (block 310), control returns to block 302 to continue monitoring.

On the other hand, if any of the component temperatures are greater than a corresponding temperature threshold (block 312), or the difference between the component temperature and the reference temperature is greater than a threshold difference for any of the measured component temperatures (block 310), at block 314 the stray current detection circuitry 210 detects that a stray welding-type current is present. At block 316, the stray current detection circuitry 210 and/or the control circuitry 208 perform a response procedure in response to the detection. For example, the stray current detection circuitry 210 and/or the control circuitry 208 may disable an output, and/or output an alarm or alert in response to the detection. The example method 300 may then end.

Figure 4:
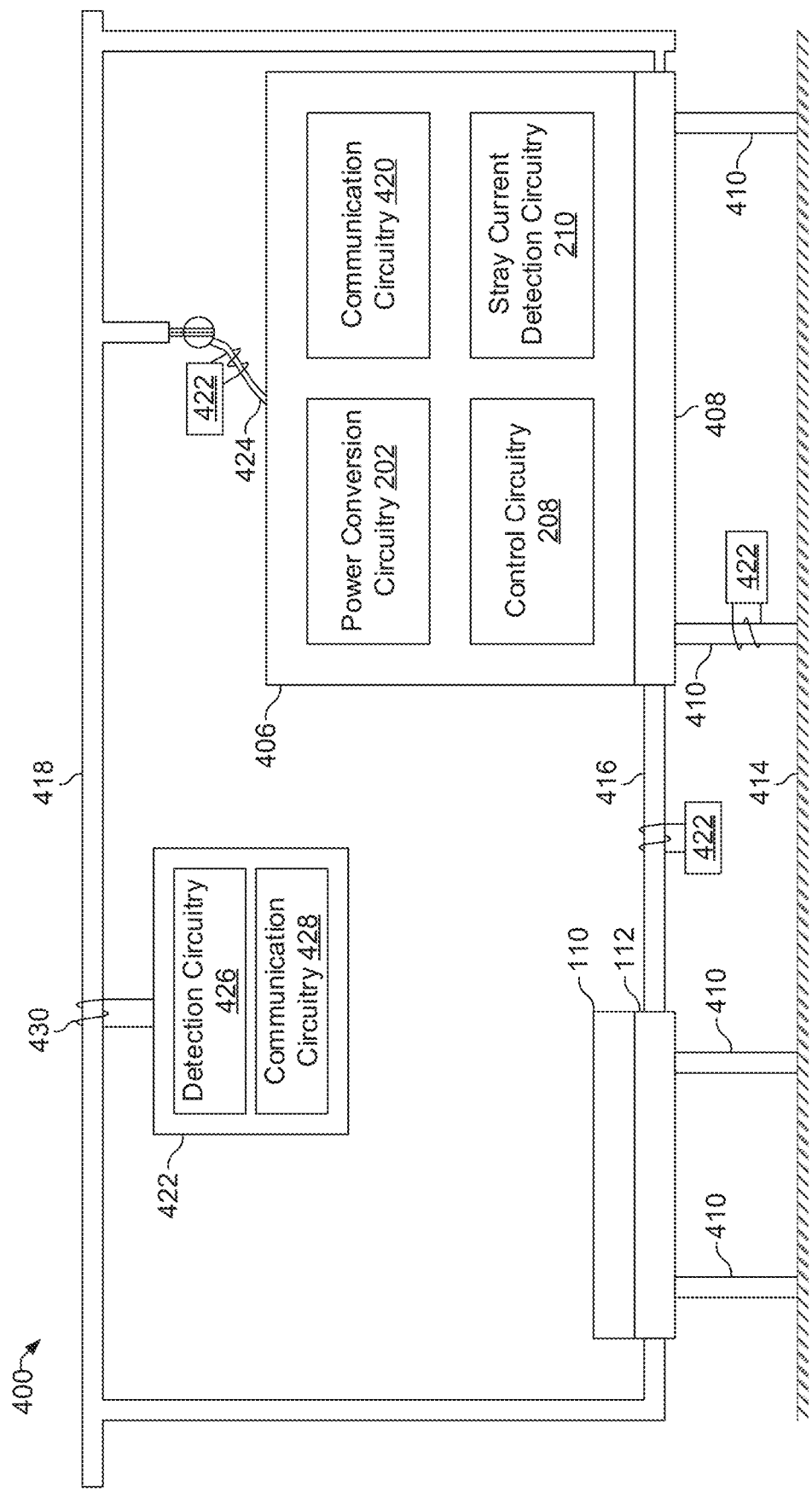
FIG. 4 is a block diagram of an example welding-type system including current sniffers configured to detect stray welding-type current and wirelessly communicate stray welding-type currents to a welding-type power supply.

FIG. 4 is a block diagram of an example welding-type system 400 including current sniffers 402, 404 configured to detect stray welding-type current and wirelessly communicate stray welding-type current signals to a welding-type power supply 406. In the example system 400, the welding-type power supply 406 is configured to provide welding-type power for a welding-type operation to be performed on a workpiece 110, which is secured to a welding bench 112.

In the example of FIG. 4, the welding-type power supply 406 is positioned on an equipment table 408. The welding bench and the equipment table 408 include legs 410, which may be constructed from a conductive material. The legs 410 rest on a floor 412, which may function as an earth ground 414.

The example bench 112 and the table 408 are coupled by a conduit 416, or other conductor. The conduit 416 may provide electrical grounding and/or a conduit path for electrical wires between the bench 112 and the table 408. Additionally or alternatively, the bench 112 and/or the table 408 may be coupled to a facility conduit system 418 for grounding, structural support of electrical wiring, plumbing, gas delivery, gas evacuation, and/or any other purpose(s).

The example power supply 406 of FIG. 4 includes the example power conversion circuitry 202, the example control circuitry 208, and the example stray current detection circuitry 210 of FIG. 2, as well as communication circuitry 420. The communication circuitry 420 is configured to wirelessly receive one or more stray current signal(s) from one or more non-contact current detectors 422 (e.g., "current sniffers"). The stray current signal(s) are indicative of whether stray welding-type current(s) are sensed by the non-contact current detector(s) 422. The example non-contact current detectors 422 may be positioned to detect currents (e.g., stray welding-type currents) in components in the welding-type environment where currents are not normally expected. For example, the non-contact current detectors 422 may be placed adjacent the conduit 416, the legs 410, facility infrastructure (e.g., the facility conduit system 418), grounding conductors 424, and/or any other possible, likely, and/or foreseeable stray current paths.

The non-contact current detectors 422 each include detection circuitry 426, communication circuitry 428, and a winding 430. The winding 430 may be placed around or adjacent the subject conductor, such that currents in the conductor induce a current in the winding 430. The example detection circuitry 426 monitors the winding 430 for induced currents, and provides a signal indicative of whether a current is detected to the communication circuitry 428. The communication circuitry 428 wirelessly transmits a stray current signal to the communication circuitry 420 of the power supply 406.

In some examples, the stray current signal may be transmitted to indicate that no current is detected, and the communication circuitry 420 may infer that stray current is present in the absence of the stray current signal from a non-contact current detector 422 for a threshold time. In some other examples, the stray current signal may be transmitted to affirmatively indicate that a current is detected, and no signal is transmitted (or only a heartbeat signal or similar signal is transmitted) when no current is detected by the detection circuitry 426. In some other examples, the stray current signal includes a payload that indicates whether a current has been detected by the detection circuitry 426. In the case where multiple non-contact current detectors 422 may be used (e.g., by the power supply 406 and/or by multiple power supplies in the same vicinity), the stray current signal may provide an identification of the non-contact current detector 422 and/or the power supply 406 to which the signal is directed.

Additionally or alternatively, one non-contact current detector 422 may feed signals from multiple windings 430 to the detection circuitry 426 to monitor multiple locations with one non-contact current detector 422. The example non-contact current detector(s) 422 are powered by battery, but may be plugged into an external source of power.

The example stray current detection circuitry 210 may respond to the identification of a stray welding-type current via receipt (or lack) of a stray current signal from the non-contact current detector(s) 422 in the same ways as described above with reference to FIG. 2.

Figure 5:
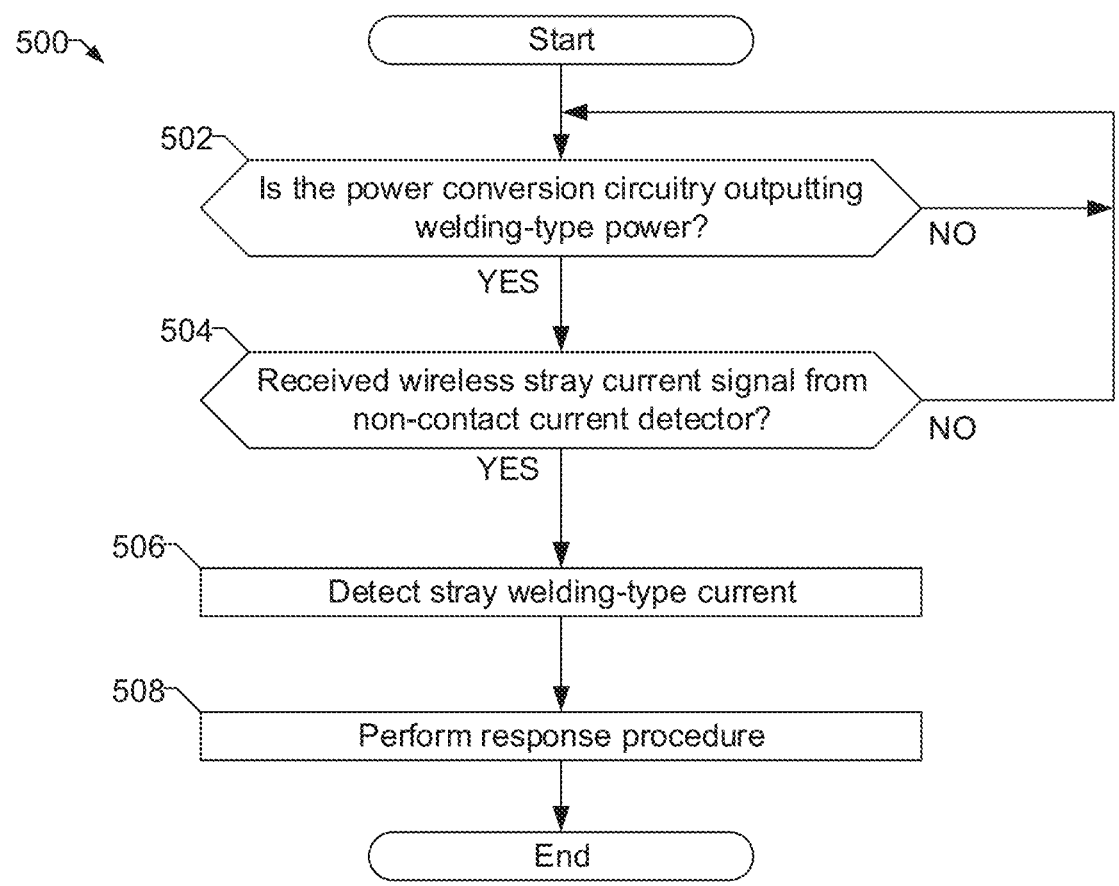
FIG. 5 is a flowchart representative of an example method which may be performed to detect stray welding-type current based on wireless communications from one or more current sniffers.

FIG. 5 is a flowchart representative of an example method 500 which may be executed to detect stray welding-type current based on wireless communications from one or more current sniffers. The example method 500 may be performed to implement the example welding-type system 400 of FIG. 4. All or part of the method 500 may be implemented using machine readable instructions stored on a machine readable storage medium, and/or executed by processing circuitry such as the control circuitry 208 of FIG. 4.

At block 502, the control circuitry 208 determines whether the power conversion circuitry 202 is outputting welding-type power. For example, the stray current detection circuitry 210 may be disabled when welding-type power is not being output. In other examples, such as when multiple welding-type power supplies share a return lead or bus, and/or are located in close proximity, the stray current detection circuitry 210, the communication circuitry 420, and the non-contact current detector(s) 422 may be configured to detect stray welding currents even when welding-type power is not being output by the power supply 200 and/or the power supply 200 is turned off. If the power conversion circuitry 202 is not outputting welding-type power (block 502), control returns to block 502.

If the power conversion circuitry 202 is outputting welding-type power (block 502), at block 504 the communication circuitry determines whether a wireless stray current signal has been received from one or more non-contact current detector(s) 422. For example, a wireless stray current signal may have been received that indicates that a current has been detected by one or more non-contact current detector(s) 422. If a wireless stray current signal has not been received (block 504), control returns to block 502.

On the other hand, if a wireless stray current signal has been received (block 504), at block 506 the stray current detection circuitry 210 detects that a stray welding-type current is present. At block 508, the stray current detection circuitry 210 and/or the control circuitry 208 perform a response procedure in response to the detection. For example, the stray current detection circuitry 210 and/or the control circuitry 208 may disable an output, and/or output an alarm or alert in response to the detection. The example method 500 may then end.

Figure 6:
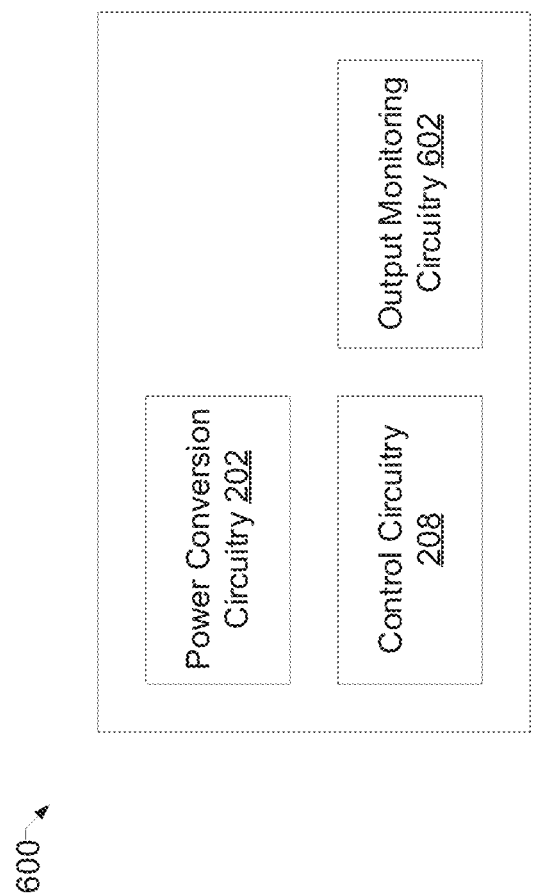
FIG. 6 is a block diagram of an example welding-type power supply configured to detect stray welding-type current based on an actual welding-type output and an expected welding-type output.

FIG. 6 is a block diagram of an example welding-type power supply 600 configured to detect stray welding-type current based on an actual welding-type output and an expected welding-type output. The example welding-type power supply 600 of FIG. 6 includes the power conversion circuitry 202 and the control circuitry 208 of FIG. 2, and output monitoring circuitry 602.

The output monitoring circuitry 602 monitors the output of the power conversion circuitry 202, such as monitoring voltage and/or current. To this end, the output monitoring circuitry 602 may include a voltage sensor and/or a current sensor. The control circuitry 208 controls the output of the power conversion circuitry 202 based on selected parameters of a welding-type operation and a control loop based on the welding-type operation.

During welding, the control circuitry 208 monitors the actual output of the welding-type power (e.g., via the output monitoring circuitry 602), compares the actual output to an expected output of the power conversion circuitry 202, and identifies that stray welding-type currents are occurring when a difference between the actual output and the expected output satisfies a threshold. If the control circuitry 208 detects a stray welding-type current, the control circuitry 208 may respond by controlling the power conversion circuitry 202 to stop output of the welding-type power, and/or by outputting an alarm or alert.

The control circuitry 208 may determine the expected output of the power conversion circuitry based on, for example, parameters such as command voltage, command current, wire feed speed, pulse parameters, and/or any other welding-type parameters, as well as parameters such as expected weld circuit impedance. For example, the control circuitry 208 may determine that, for a given command voltage and wire feed speed in a voltage-controlled wire fed process, a range of output currents is expected based on an expected weld circuit impedance (e.g., an acceptable weld circuit impedance, a most recent weld circuit impedance).

The control circuitry 208 may implement the comparison of actual output to expected output using, for example, a proportional-integral control loop and a threshold output of the PI control loop. As the instantaneous difference between an actual output sample and the expected output increases, the PI control loop approaches the threshold more quickly and, thus, more quickly identifies the presence of a stray welding-type current. Conversely, a smaller difference between the actual output sample and the expected output causes the control loop to approach the threshold more slowly.

Figure 7:
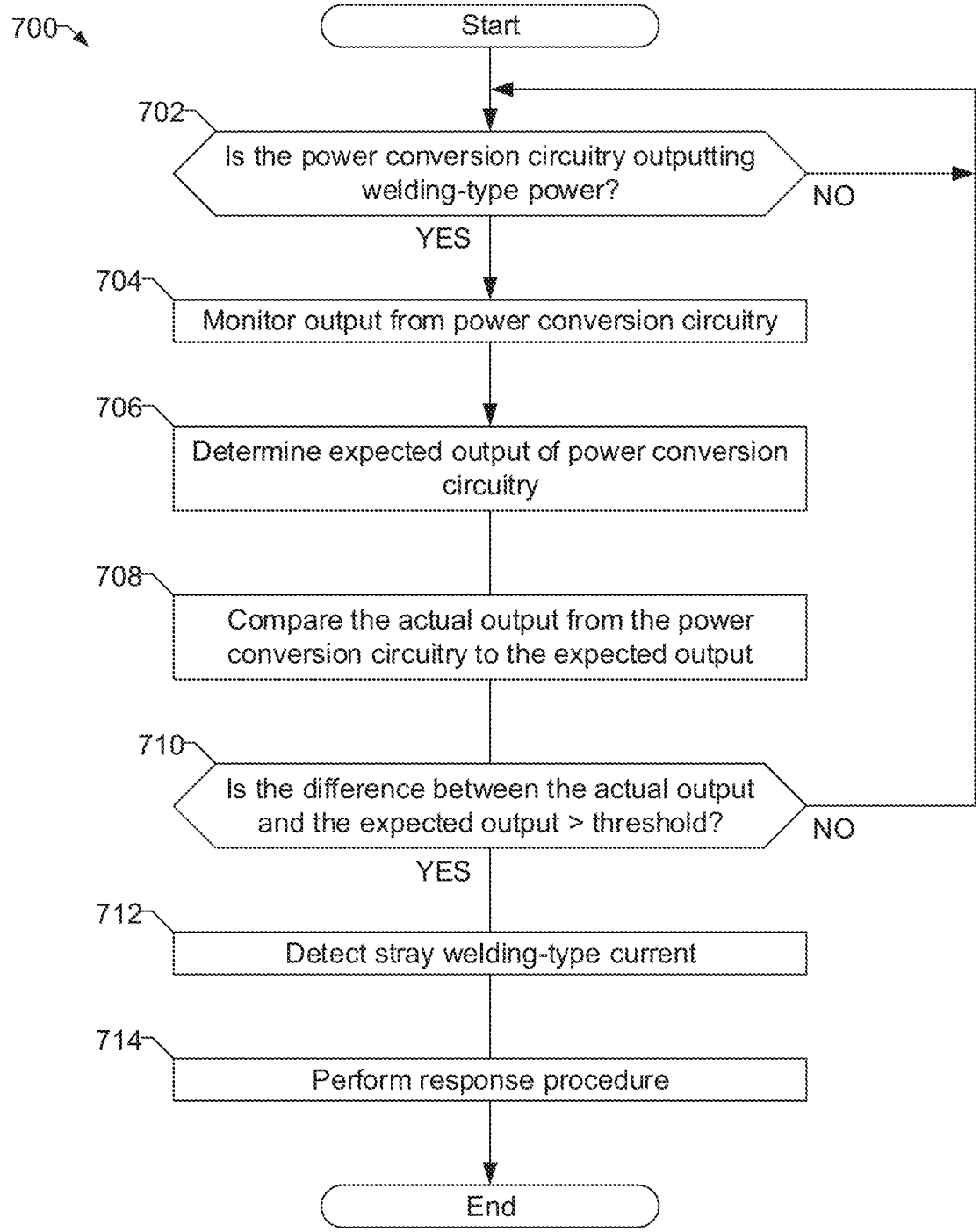
FIG. 7 is a flowchart representative of example machine readable instructions which may be executed to detect stray welding-type current based on an actual welding-type output and an expected welding-type output.

FIG. 7 is a flowchart representative of example machine readable instructions 700 which may be executed to detect stray welding-type current based on an actual welding-type output and an expected welding-type output. The example instructions 700 may be implemented by the example control circuitry 208 of FIG. 6.

At block 702, the control circuitry 208 determines whether the power conversion circuitry 202 is outputting welding-type power. For example, stray current detection may be disabled when welding-type power is not being output. If the power conversion circuitry 202 is not outputting welding-type power (block 702), control returns to block 702.

If the power conversion circuitry 202 is outputting welding-type power (block 702), at block 704 the output monitoring circuitry 602 monitors the output from the power conversion circuitry 202. At block 706, the control circuitry 208 determines an expected output of the power conversion circuitry 202. For example, the control circuitry 208 may determine that, for a given command voltage and wire feed speed in a voltage-controlled wire fed process, a range of output currents is expected based on an expected weld circuit impedance (e.g., an acceptable weld circuit impedance, a most recent weld circuit impedance).

At block 708, the control circuitry 208 compares the expected output to the actual output of the power conversion circuitry 202. For example, the control circuitry 208 may input a difference between a sampled output (from the output monitoring circuitry 602) and the expected output to a PI control loop. At block 710, the control circuitry 208 determines whether the difference between the actual output and the expected output is more than a threshold difference. For example, the control circuitry 208 may determine whether the output of the PI control loop is more than a threshold output. If the difference is not more than the threshold (block 710), control returns to block 702.

On the other hand, if the difference is not more than the threshold (block 710), at block 712 the control circuitry 208 detects that a stray welding-type current is present. At block 714, the control circuitry 208 performs a response procedure in response to the detection. For example, the control circuitry 208 may disable an output, and/or output an alarm or alert in response to the detection. The example instructions 700 may then end.

While example are disclosed herein with reference to an individual welding-type power supply, the disclosed examples may be applied to systems in which multiple welding-type power supplies are located in a same vicinity, systems in which multiple welding-type power supplies share a weld current return bus, systems in which multiple welding-type power supplies are ganged, and/or other systems in which stray welding-type current from a first welding-type power supply may be conducted through another welding-type power supply and/or equipment associated with the welding-type power supplies. For example, disclosed example systems and methods may involve responding to detections of stray welding-type currents by transmitting notifications to other welding-type power supplies within a vicinity of a power supply that detected the stray welding-type current. Similarly, power supplies may be configured to monitor for and respond to notifications that stray welding-type currents are detected by other power supplies and/or equipment associated with other power supplies. In some examples, the power supply may check for certain conditions before responding to a received stray current detection signal, such as determining whether the power supply is ganged with other power supplies and/or whether a return current bus is used. Disclosed example systems and methods may be powered using power sources that are not dependent of the power supply being actively powered (e.g., via batteries).

The present devices and/or methods may be realized in hardware, software, or a combination of hardware and software. The present methods and/or systems may be realized in a centralized fashion in at least one computing system, processors, and/or other logic circuits, or in a distributed fashion where different elements are spread across several interconnected computing systems, processors, and/or other logic circuits. Any kind of computing system or other apparatus adapted for carrying out the methods described herein is suited. A typical combination of hardware and software may be a processing system integrated into a welding power supply with a program or other code that, when being loaded and executed, controls the welding power supply such that it carries out the methods described herein. Another typical implementation may comprise an application specific integrated circuit or chip such as field programmable gate arrays (FPGAs), a programmable logic device (PLD) or complex programmable logic device (CPLD), and/or a system-on-a-chip (SoC). Some implementations may comprise a non-transitory machine-readable (e.g., computer readable) medium (e.g., FLASH memory, optical disk, magnetic storage disk, or the like) having stored thereon one or more lines of code executable by a machine, thereby causing the machine to perform processes as described herein. As used herein, the term "non-transitory machine readable medium" is defined to include all types of machine readable storage media and to exclude propagating signals.

An example control circuit implementation may be a microcontroller, a field programmable logic circuit and/or any other control or logic circuit capable of executing instructions that executes weld control software. The control circuit could also be implemented in analog circuits and/or a combination of digital and analog circuitry.

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. For example, block and/or components of disclosed examples may be combined, divided, re-arranged, and/or otherwise modified. Therefore, the present method and/or system are not limited to the particular implementations disclosed. Instead, the present method and/or system will include all implementations falling within the scope of the appended claims, both literally and under the doctrine of equivalents.

What is claimed is:

1. A welding-type power supply, comprising:
    power conversion circuitry configured to convert input power to welding-type power, and to output the welding-type power via a welding-type circuit;
    a temperature sensor configured to measure a temperature of at least one component of the welding-type power supply; and
    stray current detection circuitry configured to detect stray welding-type current based on the measured temperature of the at least one component, wherein the stray current detection circuitry is configured to detect the stray welding-type current when the measured temperature satisfies a threshold temperature.

2. A welding-type power supply, comprising:
    power conversion circuitry configured to convert input power to welding-type power, and to output the welding-type power via a welding-type circuit;
    a temperature sensor configured to measure a temperature of at least one component of the welding-type power supply;
    a second temperature sensor configured to measure a reference temperature; and
    stray current detection circuitry configured to detect stray welding-type current based on the measured temperature of the at least one component, wherein the stray current detection circuitry is configured to detect the stray welding-type current when a difference between A) the measured temperature of the at least one component, and B) the reference temperature, satisfies a threshold difference.

3. The welding-type power supply as defined in claim 2, wherein the reference temperature is an ambient temperature.

4. The welding-type power supply as defined in claim 1, wherein the stray current detection circuitry is configured to output an alarm or alert in response to detecting the stray welding-type current.

5. The welding-type power supply as defined in claim 1, wherein the stray current detection circuitry is configured to limit an output of the welding-type power in response to detecting the stray welding-type current.

6. A welding-type power supply, comprising:
    power conversion circuitry configured to convert input power to welding-type power, and to output the welding-type power via a welding-type circuit;
    a temperature sensor configured to measure a temperature of at least one component of the welding-type power supply; and
    stray current detection circuitry configured to detect stray welding-type current based on the measured temperature of the at least one component, wherein the stray current detection circuitry is configured to limit an output of the welding-type power in response to detecting the stray welding-type current and configured to continue disabling the output until a reset of the stray current detection circuitry.

7. A welding-type power supply, comprising:
    power conversion circuitry configured to convert input power to welding-type power, and to output the welding-type power via a welding-type circuit;
    a temperature sensor configured to measure a temperature of at least one component of the welding-type power supply; and
    stray current detection circuitry configured to detect stray welding-type current based on the measured temperature of the at least one component; and
    communication circuitry configured to transmit a stray current detection signal to a second welding-type power supply in response to the detection of the stray welding-type current to cause the second welding-type power supply to disable a welding-type output of the second welding-type power supply.

8. The welding-type power supply as defined in claim 1, further comprising a battery configured to provide power to the temperature sensor, and the stray current detection circuitry is configured to detect the stray welding-type current when the power conversion circuitry is not outputting welding-type power.

9. The welding-type power supply as defined in claim 1, wherein the at least one component comprises a frame, an enclosure, or a protective conductor of the welding-type power supply.

10. A welding-type power supply, comprising:
   power conversion circuitry configured to convert input power to welding-type power, and to output the welding-type power via a weld circuit;
   communication circuitry configured to wirelessly receive a stray current signal from a non-contact current detector, the stray current signal indicative of whether stray welding-type current is sensed by the non-contact current detector; and
   stray current detection circuitry configured to control the power conversion circuitry to disable output of the welding-type power based on the stray current signal, wherein the stray current signal indicates that stray welding-type current is not sensed, and the stray current detection circuitry is configured to disable the output of the welding-type power in response to an absence of the stray current signal for at least a threshold time.

11. The welding-type power supply as defined in claim 10, wherein the stray current signal indicates that stray welding-type current is sensed, and the stray current detection circuitry is configured to disable the output of the welding-type power in response to receiving the stray current signal.

12. The welding-type power supply as defined in claim 10, wherein the communication circuitry is configured to receive the stray current signal from a plurality of non-contact current detectors, and the stray current detection circuitry is configured to disable the output of the welding-type power based on any of the stray current signals being indicative of stray welding-type current.

13. A welding-type power supply, comprising:
   power conversion circuitry configured to convert input power to welding-type power, and to output the welding-type power via a weld circuit; and
   control circuitry configured to:
      control the power conversion circuitry to output the welding-type power;
      monitor an actual output of the welding-type power;
      compare the actual output to an expected output of the power conversion circuitry; and
      identify a stray welding-type current when a difference between the actual output and the expected output satisfies a threshold, wherein the control circuitry is configured to compare the actual output to the commanded output using a proportional-integral control loop.

14. The welding-type power supply as defined in claim 13, wherein the control circuitry is configured to control the power conversion circuitry to stop output of the welding-type power in response to identifying the stray welding-type current.

15. The welding-type power supply as defined in claim 13, wherein the control circuitry is configured to control the power conversion circuitry to output an alarm or alert in response to identifying the stray welding-type current.

* * * * *